United States Patent [19]

Silverman

[11] 4,107,528

[45] * Aug. 15, 1978

[54] METHOD AND APPARATUS FOR TRANSFERRING A PATTERN ON AN OVERLYING WEB BY LASER BURNING ONTO AN UNDERLYING WEB

[76] Inventor: Daniel Silverman, 5969 S. Birmingham St., Tulsa, Okla. 74105

[*] Notice: The portion of the term of this patent subsequent to Aug. 27, 1991, has been disclaimed.

[21] Appl. No.: 712,009

[22] Filed: Aug. 5, 1976

Related U.S. Application Data

[63] Continuation-in-part of Ser. No. 498,954, Aug. 20, 1974, Pat. No. 3,979,591, which is a continuation-in-part of Ser. No. 262,290, Jun. 13, 1972, Pat. No. 3,832,547.

[51] Int. Cl.² .................................................. G01D 15/10
[52] U.S. Cl. .................................... 250/317; 346/76 L
[58] Field of Search ............... 250/316, 317, 318, 319; 346/76 L

[56] References Cited

U.S. PATENT DOCUMENTS

| | | | |
|---|---|---|---|
| 3,474,457 | 10/1969 | Becker | 250/316 |
| 3,832,547 | 8/1974 | Silverman | 250/319 |
| 3,979,591 | 9/1976 | Silverman | 250/317 |

*Primary Examiner*—Craig E. Church
*Attorney, Agent, or Firm*—Daniel Silverman

[57] ABSTRACT

In the field of the storage and retrieval of information, information records in the form of patterns of microspots of small size and high packing density are formed on a record web by the use of a focussed first laser beam, of a first level of intensity, to evaporate or burn away material to form microperforations in a thin layer of opaque first material on a web of transparent plastic. This invention covers the process of preparing a facsimile record of the pattern of microspots on a master record by exposing a second record web through the microperforations in the first web to a constant intensity focussed second laser beam of less intensity than the first level of intensity. Also means are shown for using an optical pattern on a first layer to control a laser to burn openings into an opaque underlying layer.

21 Claims, 10 Drawing Figures

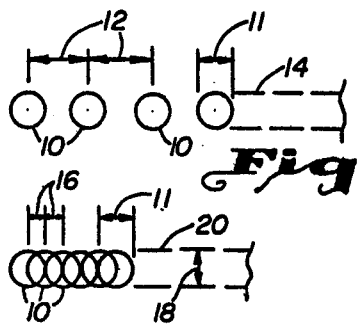
Fig. 1A.
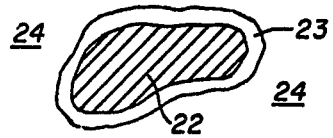
Fig. 1B.
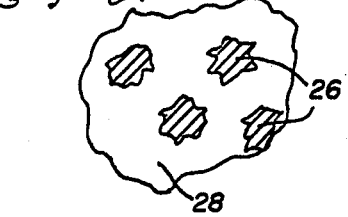
Fig. 1C.
Fig. 1D.
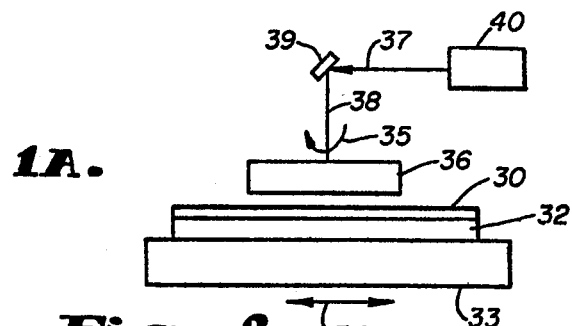
Fig. 2.
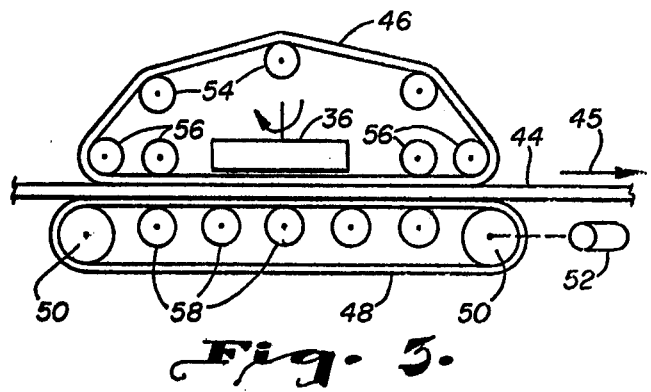
Fig. 3.
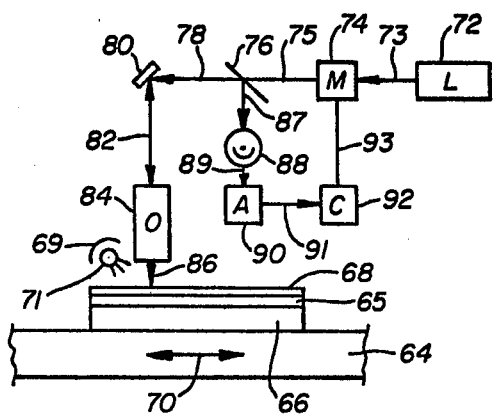
Fig. 4.
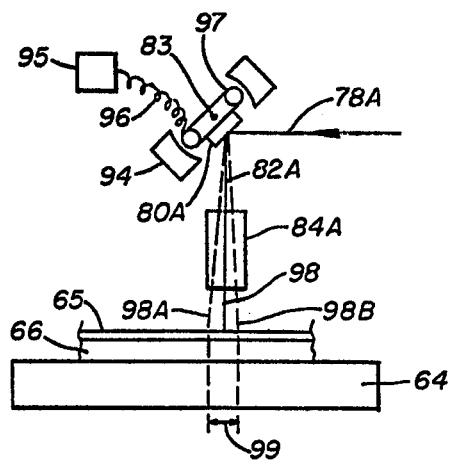
Fig. 5.
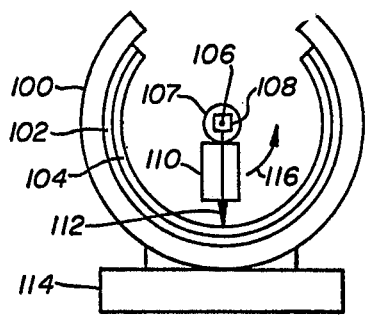
Fig. 6.
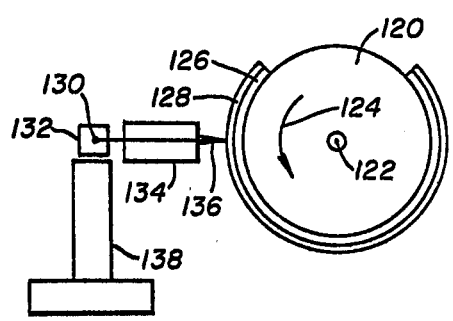
Fig. 7.

METHOD AND APPARATUS FOR TRANSFERRING A PATTERN ON AN OVERLYING WEB BY LASER BURNING ONTO AN UNDERLYING WEB

CROSS INDEX

This application is a continuation in part of my copending application Ser. No. 498,954, filed Aug. 20, 1974, entitled; Method and Apparatus for Transferring a Pattern on an Overlying Web by Laser Burning onto an Underlying Web; now U.S. Pat. No. 3,979,591, which is a continuation in part of copending application Ser. No. 262,290, filed June 13, 1972, now U.S. Pat. No. 3,832,547.

Reference is made to U.S. Pat. No. 3,474,457 issued to Becker, dated Oct. 21, 1969 entitled; Laser Recording Apparatus; and to U.S. Pat. No. 3,774,172 issued to Daniel Silverman, dated Nov. 20, 1973 entitled; Random Access Multiple Disc Optical Information Storage System.

This patent application is related also to U.S. Pat. No. 3,667,465 issued to Daniel Silverman and Everett A. Johnson, dated July 18, 1972 entitled: Method and Apparatus for Authentication of Information Records.

FIELD OF THE INVENTION

This invention is concerned with the storage and retrieval of information in the form of patterns of spots of small size and high packing density on a record web, in the form of strips, discs, and webs. More particularly, it is concerned with the preparation of the information record and of duplicate facsimiles of the information record, particularly where the spots are recorded on the record medium by means of a modulated high intensity beam of coherent radiation, such as a laser beam.

This invention is more broadly concerned with the transference of more general patterns, random or regular, made up of separate microperforations or contiguous or overlapping microperforations, to form large perforations of irregular shape, etc. The individual micropatterns or microperforations need not have importance as bits of information, but more generally, the pattern as a whole is the important quantity. In general, the master pattern will be in a thin sheet of high melting point metal bonded to a laser transparent sheet of plastic, glass or other material, so that isolated areas of metal of the pattern can be completely surrounded by metal-free areas.

PRIOR ART

In the art of information storage and retrieval, there has been wide use of photographic film as the information medium, with exposure resulting from a flying spot on the face of a cathode ray tube (CRT). More recently the CRT has been displaced by a focussed beam of coherent electromagnetic radiation from a laser, since such a focussed beam can be made of much smaller size, and thus can produce patterns of higher packing density.

The use of a focussed laser beam of high intensity permits preparation of optical records of a non-photographic nature on record media which are of such a nature the high intensity laser beam can burn or evaporate material from a thin opaque layer, such that a transparent opening is formed through the opaque layer, or conversely on opaque spot is formed on a transparent record, or a non-reflecting spot is formed in a reflecting layer, etc.

Since such a record may carry as many as $10^9$ individual spots it takes a long time to prepare the record, and in case a copy is desired, it takes an equally long time to duplicate the record by a simultaneous reading and writing operation.

SUMMARY OF THE INVENTION

This invention is concerned with a system for preparing a suitable master record by any desired means, including the use of a pulsed focussed laser, and of duplicating the master record rapidly and inexpensively to form a facsimile record of said information, which can potentially be used in place of the master record. The object of this invention is thus to provide a method and apparatus for preparing a master record of information micro spot patterns and preparing facsimile records of the master record by superimposing the master web on top of the facsimile web and irradiating the facsimile web through the micro perforations in the master web with a continuous focussed laser beam of selected intensity to burn the opaque material of the facsimile web in the same pattern of microperforations.

While the primary object is related to spaced information spots or bits, where the size and spacing are extremely small, a further important object is to prepare facsimile patterns in thin sheet material, such as metal or organic material, from a master pattern in a thin sheet material such as metal, where both sheets may be mounted on and attached to laser transparent sheets, so that the patterns may comprise large areas of perforation, surrounding areas of metal which may be imperforated.

Another important object is to transfer an optical pattern on an overlying web by laser burning into an underlying web, in which the optical pattern controls a pulsed laser.

Reference is made to the copending application Ser. No. 498,954, of which this application is a continuation in part, and which is entered as part of this application by reference. In the drawings and specifications of Ser. No. 262,290 it is clearly taught the basic process of this invention, namely the preparation of a master web comprising a layer, or strip or sheet of a first material carrying a pattern of perforations, or a pattern of opaque and transparent areas.

These can be micropatterns of microperforations, or can be macropatterns of regular, irregular or random perforations, or large areas, which are to be transferred to an underlying facsimile web. This transfer is accomplished by pressing the two layers into intimate contact, and sweeping a focussed laser beam of constant intensity over the entire area of the master web in a series of parallel tracks, so that the focussed laser beam will pass through the transparent or perforated areas in the master web and will be focussed on the surface of the underlying web and will burn an identical pattern in the facsimile web.

As fully described in Ser. No. 262,290 we are concerned with regular X-Y patterns but in which the microspot spacings and size are so small that a stop-position-burn-move operation cannot be reliably depended on. Also we are concerned with copying random patterns of spots of the same or different size, including microperforations of dimensions and spacing as small as 0.001 inch or less. Also we are cocerned with patterns in which the spots are extremely small and must be accurately positioned—such as in the preparation of color masks for color television tubes.

Also in the manufacture of irregularly shaped parts of thin metal sheets such as springs, marks, gears, filters, etc.

The master record may be formed in a regular pattern, by the method disclosed by Becker in which a pulsed focussed laser burns spots along a line on a thin metal sheet on a drum turning at constant speed, and the modulation or pulsing is controlled by computer in terms of the rotational angle of the drum.

Or the master can be made by means of an optically reduced pattern on a sheet and precisely photo etching the pattern into a sheet of high melting temperature metal. The copies or facsimiles can then be produced without technical skill by the method of this invention.

In U.S. Pat. No. 3,832,547 it was taught in FIGS. 1, 2, 3 and 4 how to prepare the master web by burning holes by means of a pulsed focussed laser, by relatively moving the laser beam and the web, and pulsing the laser at proper relative positions, or at proper times, to create the desired pattern. It was pointed out that the most useful application was for the transfer of information patterns of closely packed microperforations representating bits of information, such as shown in FIGS. 9 and 10.

It was further taught that if the two webs comprise metal films, that the top web must be either of higher melting point than the lower web, or it must be thicker, or of higher heat conductivity, etc.

Further it was shown in FIGS. 5A, 5B, 6, 7, and 8 how the micropattern in the master web could be transferred to the underlying web.

In this application, description and adaptations of the basic principles will be broadened to include not only regular micropatterns of microperforations, but also to irregular and random micropatterns; also to include irregular and random patterns of macroperforations, or more generally to large areal patterns of opaque and transparent areas, where, for example, small areas of metal film are surrounded by large areas where the metal has been burned away. This means, of course, that an underlying support film of plastic, glass or other laser transparent material must be provided to which the metal film is bonded prior to preparing the master pattern.

Thus the pattern could be isolated opaque areas of the shape of alphanumeric characters surrounded by transparent space, so that the facsimile can be a relief sheet such as for printing, or can be a sheet for electrostatic printing, etc.

Also, the patterns can be simple outlines of selected shapes so that as the end product the underlying web, which can be metal will be one or a plurality of separate intricately shaped metal pieces, such as used in micromechanism, such as springs, gears, cams, ratchets etc.

Of course, the facsimile web need not be metal, but can be of organic material such as woven cloth, where the outlines describe appropriate pattern shapes.

In this application it will be taught other ways to prepare the master web, such as by sweeping a focussed laser completely over the surface of the web, which has been prepared on its surface with the desired optical pattern in reflecting and non-reflecting areas, or black and white areas, etc, and to control the intensity of the laser in terms of the reflectivity, or color etc. of the surface optical pattern, also other ways will be shown in which the sweeping beam can be swept across the surface of the master web, such as by forming the webs into a cylindrical form and scanning the laser beam rotating radially about the axis of the cylinder.

Also the sweeping beam can be swept in a raster pattern of a plurality of parallel rows, by deflecting the beam in two orthogonal directions by electrical crystals, or by rotating mirrors etc.

Also it will be taught that the sweeping beam, while moving in the X direction, for example, can be oscillated in the Y direction over a limited area, such as by an oscillating mirror, for example, so that a wider strip of the master web surface can be covered on each pass of the scanning beam. Since the time required for burning is so short and the speed of mechanical scanning so slow, this expedient is equivalent to speeding up the scanning rate manyfold.

While this invention has been discussed in terms of relatively low power lasers in combination with thin metal films, the basic process can be applied to the case of thicker metal and/or organic sheets or plates, or in general, wherever many copies must be made of selected patterns. Since the precision and power of cutting with a laser is so high, this opens the possibility of construction of large precision metal parts to this process.

Also, the words "sheet", "strip", "web", "record", will mean the material which comprises the master or the facsimile. These can be a single "layers" or "films" of metal or other material, or they can be composite webs of an underlying layer of laser transparent (inactive) material such as plastic or glass, etc. and an overlying bonded layer of metal or other (active) material which may be organic or inorganic.

BRIEF DESCRIPTION OF THE DRAWINGS

These and other objects, details and advantages of this invention and a better understanding of the principles and details of the invention will be evident from the following description taken in conjunction with the appended drawings, in which:

FIGS. 1A, 1B, 1C, 1D illustrate various types of patterns transferrable by the method of this invention.

FIG. 2 illustrates schematically the basic process of this invention.

FIG. 3 illustrates one embodiment for transferring a master pattern on a master web loop to a continuous strip of facsimile web. FIG. 4 illustrates an improved embodiment of this invention.

FIG. 5 illustrates an improvement of FIG. 4.

FIGS. 6 and 7, illustrate two embodiments for relatively scanning a laser beam and the superimposed master and facsimile webs.

DESCRIPTION OF THE PREFERRED EMBODIMENT

While the subject is fully covered in Ser. No. 262,290, it may be well to discuss again the general subject of "burning", "cutting", "melting", "evaporation", etc. It is well known that a focussed laser beam, even of low wattage, can present a high power beam over a small area, which when directed to metal and other materials, causes softening, melting, oxidation, sublimation and other chemical actions, which result in the alteration and/or removal of an area of the material. Since it is not known exactly what happens in each case, it will be understood that the terms of "cutting", "burning", "melting", "evaporation", etc. will mean the process of removing material. Also the term "melting" point and "boiling" point and "cutting temperature" will indicate the general value of temperature of the material, at which the material is removed or cut by the laser beam.

It will be clear that in order to cut the underlying material through perforations in the overlying material, without cutting the overlying material (and destroying the master pattern) the melting point of the master sheet must be higher than that of the lower sheet, or, the upper sheet must be more massive and thus have higher thermal capacity than the lower sheet, or, the upper sheet must be thicker than the lower sheet, or the upper sheet must have a higher thermal conductivity than the lower sheet, or, the laser beam must have a sharper focus on the lower sheet, etc.

Referring now to the drawings and in particular to FIG. 1, there is shown various types of patterns which are amenable to handling by the apparatus and methods of this invention.

FIG. 1A shows a series of circular (or other shaped) perforations 10, of diameter 11 spaced apart by distances 12, along a track 14. This is the conventional information storage format.

FIG. 1B shows a plurality of perforations of diamater 11, along a track 20, but the spacing is now 16, which is less than the diameter 11. Thus by reducing the spacing 16 to a small fraction of diameter 11, a smooth-edge, parallel-edge strip or cut of width 18 can be made in the material.

FIG. 1C shows a closed loop cut, or track 23 enclosing an irregular shaped area 22 of material, and a surrounding area 24 of the same material. The enclosed area could be of any desired shape such as gears, cams, alphanumeric characters, etc. that might need to be made. If a short run of such parts are needed, this invention provides a quick and simple way to prepare them, and avoids the cost of expensive dies, etc.

FIG. 1D shows a situation where the opaque, uncut areas 26 are small and the cut-away area 28 is large. The areas 26 could again be small mechanical parts or printing type characters, etc. Of course, to make the type of pattern as in FIG. 1D the material (say metal) sheet must be bonded to a carrier sheet of laser transparent material such as plastic, glass, etc.

In FIG. 2 is shown schematically a mechanism for scanning a laser beam over the complete surface of the master web. This is patterned after the mechanism of FIGS. 6 and 7 of Ser. No. 262,290. It can also be other mechanical systems, such as a reciprocating head moving on a track operated by a crank and arm mechanism (like a "shaper" machine) or a rack and pinion drive. It can also include slower movement in one direction (the cutting direction) and fast return, with perhaps the laser being turned off during the return movement. It also includes the embodiments of FIGS. 4, 5, 6 and 7 as will be further described.

FIG. 2 shows a master web containing perforations in an opaque sheet 30 or more generally areas of an opaque material of greater laser resistance to cutting, than the material of the facsimile web 32, with adjacent or surrounding areas of a laser transparent material. The facsimile web 32 would comprise generally a layer of laser cutable material on a laser transparent (uncutable) material. These master and facsimile webs might correspond to the webs 24, 26 and 74, 76 respectively of FIGS. 5A and 5B of Ser. No. 262,290.

A rotating optical system 36 corresponding to 84 of FIGS. 6 and 7 of Ser. No. 262,290. This system 36 rotates about axis 38 and is supplied with a laser 40, whose beam 37 projects to a mirror 39 and then axially to the optical system 36. The webs 30 and 32 can be of limited size and can be placed on a work table 33 that moves in accordance with arrows 34.

In FIG. 3 is shown a modification of FIG. 2 in which the facsimile web is a long sheet or strip, out of which many facsimile copies are to be cut. The master record can be in the form of a closed loop web, which runs in contact with the top surface of the facsimile web 44, which moves in the direction 45.

The master loop 46 is supported on a plurality of rollers 54 so as to provide space for the optical system 36. Of course, the master web can also be a long strip like the web 44. The principle drive is a belt loop 48 driven by rollers 50, through motor 52, support rollers 58, under the belt 48, and pressure rollers 56 press the master web, the facsimile web and the belt 48 together so that they all run without relative displacement. The apparatus of FIG. 3 is adaptable to high production automatic operations with essentially minimum manual attendance. Of course, other equivalent mechanical systems can be used in place of that shown in FIG. 3.

Reference is made to U.S. Pat. No. 3,774,172, which has been made of reference in this application. In FIGS. 6A and 6C there are shown photosensor means 98A and 98B, which are adapted to detect light from the laser focussed on the record surface 74 and scattered back. Before the perforation is made, light scattered back will be high intensity but after a perforation is made, the light back-scattered will be less. Thus by measuring the response of the sensors 98, it can be determined whether the beam 86A or 86B is directly over a perforation, or over an unperforated area of the web.

In FIG. 4 is shown another embodiment of an optical system in which back-scattered light can be detected. Here a master web comprising base layer 68 and active layer (such as metal) 65 on a table 64 capable of translation in accordance with arrows 70. A laser 72 provides beam 73 through light modulator (light gate) 74. The modulated beam 75 goes through partially reflecting mirror 76, and, as beam 78 to mirror 80 and beam 82 to optics 84, which brings the beam 86 to a focus at the surface of the metal layer 65. When the light gate 74 is open, the focussed beam is intense enough to burn a perforation in the metal layer 65. When the light gate is closed, a small amount of laser light passes through to the surface 68. This is sufficient to provide back scattered (reflected) light back through optics 84, beam 82, mirror 80, beam 78 to partially reflecting mirror 76, where the beam is deflected as beam 87 to the photosensor 88.

The electrical signal generated by the photosensor 88 due to the reflected light from the surface of the master web, through beam 86, goes by leads 89 to amplifier 90, to control means 92 through leads 91, and by leads 93 to the light modulator or light gate 74.

The light back-scattered from the master web 65 and 66 can be reflected by the metallic surface of 65, which when the metal is unperforated will reflect light, and when the metal is perforated (the reflective surface is removed) will not reflect light. It will be clear also, that a patternn of black and white can be printed or otherwise transferred to the surface of 65. Here the white part will reflect or scatter back light, whereas the black part will not. This type of pattern can be transferred to the surface of metal layer 65 by printing, xerography, photography, silkscreening, etc.

It will be clear also that a preprinted sheet 68 of the desired dimension, can be attached as by adhesive to the top surface of metal layer 65 so that the light and dark, or color pattern recorded thereon, can be used to control the light gate.

Let us consider the method of operation with a printed pattern 68, in which black and white, or non-reflecting and reflecting areas, form the pattern. There is a relative scan of the beam 86 over the surface of the pattern 68. Assume that the focussed beam 86 is of low intensity, by the fact that the light gate 74 is almost closed, then, because of the non-reflecting surface 68, little or no light goes back through the optics 84 and to the sensor 88 and the control signal from amplifier 90 is weak. Thus the control 92 leaves the gate partially closed. However, when the pattern passing under the beam 86 becomes reflecting, the large signal output from 90 to control 92 causes the gate to open, and the high energy laser beam becomes focussed on the layer 65 and causes a perforation to be made. This removes the reflective surface and the beam is again cut off. However, as the beam 86 scans further it again sees reflective surface and the strong beam again comes on.

As a practical matter such a control will keep calling for strong beam whenever the sensor receives sufficient light so that if the beam scans the entire surface of 65 (or 68) in contiguous parallel strips, then all of the reflecting area of the metal 65 will be removed and all of the non-reflecting area will remain.

Various methods of scanning the beam 86 over the surface 68, 65 can be devised. One shown in Ser. No. 262,290 in FIGS. 6 and 7 can be conveniently used.

Another method is to wrap the master web around a drum with the surface 68 outermost and rotate the drum at high speed while moving the optics 84 and beam 86 along an element of the cylindrical surface of the web. The beam 86 will then mark out a helical pattern on the surface so as to scan over the entire surface. Also, the web 65, 66, 68 can be formed into a cylindrical form with the surface 68 innermost. The beam 86 can then be directed radially and rotated about the axis of the cylinder as it is moved axially. These types of operation will be explained in detail in connection with FIGS. 6, 7.

While in FIG. 4, I have shown a weak beam passing from laser 72 to illuminate the surface 68, it is possible also to have a separate luminous source 71, 69 to illuminate the surface under the optics 84. It is possible also to have the light sensors positioned as in U.S. Pat. No. 3,774,172. However, the embodiment of FIG. 4 is preferred.

Normally, to get a high power beam impinging on the surface 68 from a laser of minimum power output, the beam 86 will be brought to a sharp focus at the surface of the metal sheet which is to be cut. Therefore, the area of the metal film 65 which is cut is quite small, and may be the order of 0.001 inch, or less. Thus, the rows of scan of the beam must be closely spaced, and because of the limited speed of the mechanical parts it may take a long time to cover the entire area.

In FIG. 5 I show a modification of the embodiment of FIG. 4 in which the mirror 80A (corresponding to 80) is mounted on a coil 97 which is adapted to oscillate about an axis 83. The coil 97 is positioned in the magnetic field of magnet 94, and supplied with an A.C. current from oscillator 95 through leads 96. Thus the beam 98 through the optics 84A can be deflected to positions 98A to 98B. Since the cutting action of the beam 98 is very rapid, the oscillation of the beam 98 can be very rapid. Thus the cutting beam moving in a direction parallel to axis 83 scans a broad strip of dimension 99, which can be many times wider than the focussed beam 98. Thus for a fraction of the number of mechanical scans, the entire area can be scanned by beam 98. Of course, there are other ways well known in the art to deflect the beam in an oscillatory manner over a limited amplitude.

If a greater powered laser is used, the focussing does not need to be so sharp. Therefore a longer focal length optics 84 can be used. This permits other means for scanning the beam, by means of electrical crystals, and revolving mirrors, which are well known in the art.

The system shown in FIGS. 4, 5 will transer an optical pattern on an overlying surface to an underlying surface by controlling (pulsing) a laser so as to focus the laser onto the metal surface and passing intense optical energy in accordance with the optical properties such as color, light and dark, and/or reflectively, of the pattern. While I have given as an example the burning of a thin metal layer, the underlying area could be a thin or a thick metal layer, or an organic material layer such as plastic or woven material, etc. Also the pattern can be positioned on the surface of the web to be cut, or it can be on a sheet or web (such as paper, plastic, etc.) positioned on top of the master web.

It will be clear also, that while I have described FIG. 4 in terms of a control 92 that increases the laser power whenever the reflected light increases, the operation can be controlled in reverse. That is, the laser power increases when the light decreases. In this case, the record or pattern on top of the master web can be a reflective metal film on a laser transparent sheet, with a precut pattern. Now, whenever the beam 86 sees the reflective (uncut) surface of the film, the laser power is low. When the beam 86 sees a cut-away portion of the reflective surface, the cut being non-reflective, the high laser power is applied.

This condition compares to that in Ser. No. 262,290 where there is no optical control on the beam, but the patterned layer (now the master web) serves as a simple mask shielding the underlying facsimile layer. As mentioned above, the pattern can be an optical pattern on a disposable (cutable) web of paper, etc. Or it can be a pre-cut metal web, which optically controls the beam which is pulsed in accordance with the optical signal. Or if the metal is laser resistive, it can (mechanically) shield the facsimile web from the continuous laser beam.

In FIGS. 6, 7 are shown two embodiments, other than those shown in FIGS. 6, 7 of Ser. No. 262,290 and FIGS. 4, 5. In FIG. 6 the sheet to be cut (that is, the underlying facsimile sheet 102) is beneath the overlying master sheet 104 which can be an optical pattern to control the beam, or it can be a metal layer of such thermal characteristics that it can accept the continuous laser beam without being cut, thus shielding the underlayer 102, except where there is precutting of the sheet 104, so that the unshielded beam can focus directly on the lower sheet.

The sheets 102, 104 are formed closely to the internal circular cylindrical surface of the housing 100. They can be held by any means, such as vacuum, etc. The optics 110 is attached to an axial tubular shaft 107 rotating about its axis. The laser beam 106 passing along the axis is deflected by mirror 108 radially to the surface 104. The shaft 107 and optics 110 rotate in the direction of the arrow 116. Means are provided to axially relatively move the shaft 107 with respect to the housing 110 to sweep over the entire area. The improvement of FIG. 5 can, of course, be used here also.

In FIG. 7 is shown a similar embodiment except that the sheets 126, 128 are attached to the outer surface of a cylindrical drum 120 that rotates about axis 122 in the direction of arrow 124. Here the mirror 132, beam 130, optics 134 and focussed beam 136 perform as in the case of FIG. 16.

Reference is made to FIG. 8 of Ser. No. 262,290. Here the focal point of beam 98 is shown of minimum diameter 108 at the surface of the second layer, more specifically the focal point is preferably on the surface of the second material of the second layer. Then by making the layer 24, 26 of sufficient thickness, the beam 98 is de-focussed at the surface 26 of the master web, that is, at the surface of the first metal layer, and is thus of lower power per unit area, whereas, the beam at the focal point, at the surface of the second material 76, of the second layer 74 will be of maximum power per unit area. Thus even though the first and second materials may be the same, because of the higher-power of the beam 98 on the lower metal perforations will be burned into the second layer, but not into the first layer.

Such a system can be described as one in which the first material layer lies in a portion of the laser beam which is of lower unit power, while the underlying second material lies in a portion of the laser beam which is of higher unit power, sufficient to burn away said second material while not burning away the first material. By this means identical material can be used in the first master and second (facsimile) webs.

It is possible also to get different relative action of the laser beam on the first and second layers, even if the materials of these layers are the same, by making the upper layer more massive, and thus of greater heat conductivity and greater thermal capacity.

Another possible condition, is one in which the first material is of higher melting point than the lower material.

The method of FIG. 4 uses a first material which provides optical control, but no thermal masking of the second material. The first material can be a printed pattern on a sheet of paper, for example, where the paper is the first material. Or it can be printed directly on the material to be cut, in which case the first material is the physical film of ink or paint, printed on the surface.

NEW APPLICATION

This application, which is similar to its copending parent application Ser. No 498,954, includes the same specification and drawings as Ser. No. 498,954, with some extension of details previously described.

In Ser. No. 498,954 the previous description of the method of copying patterns of perforations was expanded from micropatterns of microperforations in informations systems, to larger patterns of larger perforations, such as macropatterns of macroperforations. It was also extended from isolated openings, perforations or transparent areas in a more or less continuous opaque web or sheet, such as of thin metal, for example, to isolated islands of opaque metal (carried by a laser transparent web), surrounded by transparent space. In this case, the concept of transparent openings in a continuous opaque sheet is inverted, to comprise isolated opaque areas in a large transparent area.

In this application, this same concept will be included, and the word "perforation" (which normally denotes a small transparent opening in an opaque sheet) will be used also to denote large, regular, or irregular, transparent areas, surrounded by opaque material, as well as the reverse, such as islands of opaque material surrounded by large transparent areas.

In the original U.S. Pat. No. 3,832,547, it was considered that both the master web and the facsimile web would be thin metal sheets, the master web being of such material and/or construction as to withstand (without being cut away) the focussed laser of intensity I, which, passing through the transparent areas of the masterpattern, would cut away the facsimile web in the same pattern.

In Ser. No. 498,954 and in this application, the concept is extended to facsimile webs of materials other than metal, such as organic materials, including but not limited to woven cloth, leather, wood, wood fiber compositions, plastics and similar materials, and generally any material that can be heated by the focussed laser beam to burn, melt, or evaporate, to provide perforations through the opaque material, or depressions in the surface of the opaque material.

Also, the concept is extended to thick layers of material, including metal, where the depth of penetration of the laser beam is less than the thickness of the underlying material, so that depressions in the surface are formed, leaving part of the original surface standing above the background cut away by the laser, as in a letter press printing plate.

The depth of penetration of the focussed laser beam depends on the intensity of the beam, and on the rate of movement of the beam across the surface, or stated another way, the residence time of the beam. The higher the intensity, and the longer the residence time, the deeper the penetration. However, for short focus beams, with short depth of focus, the change in focus with depth will tend to diffuse the beam, and limit its ultimate depth of penetration.

While I have described this process and apparatus as "superimposing the master web on the facsimile sheet or web in fixed relation", as was fully described in U.S. Pat. No. 3,832,547, the two webs can be plane and contiguous, or plane and parallel, but separated, as by a transparent sheet or web, or other means, as is described in relation to FIG. 8 of U.S. Pat. No. 3,832,547. By this separation, for short focus beams, when the beam is focussed on the underlying layer, it is defocussed at the master layer, thus minimizing the heating effect on the master layer. Consequently when I speak of superposition of the master and facsimile sheets or webs, I mean in contact, or spaced apart a selected distance. The term fixed relation concerns the lack of lateral or longitudinal displacement of one web with respect to the other.

Also, while the case of plane sheets is fully described in U.S. Pat. No. 3,832,547, the possibility of superposing the master and facsimile webs can be done on a cylindrical basis, such as shown in FIGS. 6 and 7, for example. In FIG. 6 the master web would be 104, and the facsimile web 102. In FIG. 7 the master web would be 128 and the facsimile web 126. In the cases of FIGS. 6 and 7, while the patterns transferred would be the same, the dimensions would be slightly different, circumferentially, dependent on the radial spacing between the master and the facsimile webs and the radius of the drum or shell.

Application Ser. No. 498,954, the parent of this application, shows two principal embodiments. One is the embodiment of scanning a master pattern web with a constant intensity focussed laser beam, as in U.S. Pat. No. 3,832,547. The other is the embodiment of using a controlled focussed laser beam scanned across the surface of the web, the intensity of the beam being controlled in response to an optical pattern on the top layer.

Both of these embodiments can be modified in the same way, in relation to the nature of the materials, laser intensities, etc. Also, the concept of a master loop, or a closed loop of master web, such as described in relation to FIG. 3, can be applied to both embodiments. For example, the loop can be a laser resistant template, which is scanned by a constant intensity beam. Or the loop can be a web carrying an optical pattern which is used with a variable intensity laser beam, controlled by the optical pattern on the master sheet or loop. The loop can be an optical pattern on a sheet of paper, for example, which is expendable, or it can be a pattern on a thin layer of polished metal on a transparent plastic sheet, for example, with the laser controlled to reduce the radiation to a minimum value, insufficient to cut the underlying material, whenever light is backscattered from the polished or shiny metal surface. In this way the shiny surface prevents the laser from cutting the thin metal carrying the pattern.

With further reference to the second embodiment, as described in relation to FIG. 4, it will be clear that the radiation which is backscattered by the pattern, and used to control the intensity of the focussed laser, can be a separate luminous source, or it can be part of the light of the laser 72 taken prior to the intensity control 74. It also can be the controlled laser beam itself, such as the use with a highly reflecting layer pattern as described above.

The optical pattern can be a black/white, or dark/light, or one color/other color pattern, or a reflecting-/nonreflecting pattern, etc. The pattern sheets can be disposable, such as a printed, screened, xeroxed sheet, or photograph, which is destroyed by the laser cutting the underlying sheet. Or the pattern sheet can be a thin layer of shiny material, such as a thin layer of shiny, polished metal on a transparent plastic, for example, where the reflecting surface serves to cut off the laser beam, and vice versa. Such a metal sheet can be used over and over, and can be formed into a loop, such as in FIG. 3, for example.

In U.S. Pat. No. 3,832,547 the primary accent was on the use of this invention in information records, that is, in records for storing alphanumeric information in the form of binary bits, for example, in the form of very small microperforations. These microperforations require a very sharply focussed laser beam. Where extreme precision is required in perforation size or shape, sharply focussed laser beams should be used. Such sharply focussed beams are generally short focus, generally having short depth of focus. That is the reason for the optical system described in FIGS. 6 and 7 of U.S. Pat. No. 3,832,547. That is, the optical system must be moved in such a way that the point of focus of the beam is on the surface to be cut at all times. That is why the optical system in U.S. Pat. No. 3,832,547 is moved parallel to itself over a plane pair of webs, or is used as in FIGS. 6 and 7 of Ser. No. 498,954, with cylindrical webs.

In this connection it will be clear that the transport of the loop or strip, in plane configuration, as in FIG. 3, can be converted to that of FIG. 6 for example, where the two strips are temporarily formed into a portion of a cylinder, and slid longitudinally (axially) through the stationary form 100, for example. This embodiment would be simpler to carry out, if the radius of the form 100 was larger and the angular coverage of the strips 102, 104 around the form were small. The strips can, of course, be the master and facsimile webs, of the first embodiment, or optical pattern and underlying web, as in the second embodiment. An example, of such strips being formed in to cylindrical form and traversed in a cylindrical mandrel is shown in U.S. Pat. Nos. 2,877,080, and 2,881,044.

Where the precision of cutting required, is less, a longer focus laser beam, of longer depth of focus, can be used. In this case it is not quite so necessary to maintain a constant distance of the optical means from the workpiece. In this case, the laser beam can be scanned across the strip by a rotating, faceted mirror, or prism, for example, as is well known in the art, and need not be described further. Also, with plane master and facsimile webs, the laser can be scanned in a two dimensional raster pattern by means of the rotating faceted mirror and a second rotating mirror with axis of rotation at right angles to the axis of the first. This case is well known in the art and need not be described further. Also, the laser beam can be deflected in two orthogonal dimensions by the use of appropriate charged crystals as described in the art.

In FIG. 7 the master and facsimile webs are in the form of cylinders, and the scanning of the laser is in the form of a helix over the surface of the cylinders. It is possible to traverse the master and facsimile webs, or the optical pattern and the underlying web, in the form of superimposed strips over a plane surface with the optical system rotating as in FIG. 2. Also, it is possible to pass the superimposed strips over a rotating drum, and traverse the beam along an element of the cylinder parallel to the axis of the cylinder, and so on.

It will be clear that while I call for an underlying facsimile web, or an underlying web under the optical pattern, the underlying web can be a thin sheet or film, or the surface layer of a thick slab or plate, of an appropriate material. Also, the thick slab or plate can be made of a base slab or plate with a surface layer of thin material attached to the surface. For example, the base slab can be a thick layer of high temperature material with the thin layer of lower temperature material.

Such a system would also include means to limit the maximum intensity I of the focussed beam so as to burn the top thin layer without burning the lower thick material. This type of slab might include a thick layer of high temperature metal, or other conducting material, with a plated thin layer of lower temperature material, such as metal.

In these two cases, the depth of burning is controlled by the thickness of the top lower temperature material. The depth of burning as previously described, can also be controlled by the intensity of the laser beam, by its sharpness of focus, depth of focus, etc.

The system of U.S. Pat. No. 3,832,547 and of application Ser. No. 498,954 can be used for cutting thin sheets, films or webs of selected material, by laser burning, into selected patterns of opaque and transparent areas. Where the transparent areas are of large extent and surround the islands of opaque material, a composite web of a thin opaque burnable layer is attached to an underlying transparent sheet, or unburnable sheet, or plate.

The burning of part of the web can be controlled as in the first embodiment by a master web with a selected pattern of opaque and transparent areas, where the opaque areas have a thermal characteristic, such as higher temperature, etc. so that the master web is not burned by the focussed laser beam.

The burning of the web can also be controlled (as in the second embodiment) by an optical pattern and a focussed laser beam of controllable intensity. Here the optical pattern layer may be expendable, or not, depending on the type of control exerted by the optical pattern onto the laser system.

Once the master web is prepared, such as by use of the second embodiment, then a great number of duplicate patterns can be cut with simple apparatus as in the first embodiment.

Where the number of copies to be made is few, such as only one of each pattern, then the second embodiment offers the simplest system. All that is needed is to prepare the optical pattern, and apply the pattern to the top surface of the underlying material, and then follow the process of the second embodiment.

This process can be used for cutting specialized patterns, in metal or organic sheets and/or composite sheets, etc. This can be used for cutting and preparing shims, washers, gears, cams etc. Here the computer can be used to draw curves described by mathematical equations, etc.

The process can be used for cutting the conducting metal surface of printed circuit boards, or for manufacture of electrical grids, springs etc. Incidently the specifications of the pattern in terms of computer signals can be transmitted from the point of origin to the point of manufacture, where a computer prepares the drawing of the pattern. Or conversely, the drawing of the pattern can be prepared at the point of origin, and the picture transmitted by conventional facsimile transmission equipment, and so on. It will be clear, of course, that the pattern can be made up of line drawings or photographs which are half tone screened, and may include alphanumeric information.

It will be clear that composite printing plates can be prepared by this system, once the pattern drawing is available.

And, of course, where large numbers of copies are required, a master web can be prepared by the method of the second embodiment, and the copies made by the method of the first embodiment, since the apparatus of the first embodiment is inherently simpler than the method of the second embodiment.

While the invention has been described with a certain degree of particularity, it is manifest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

What is claimed is:

1. A system for directly transferring a preselected pattern of opaque and transparent areas in a first metal web to an underlying second web, comprising;
   (a) a master web comprising a first metal layer carrying said preselected pattern of opaque and transparent areas, said first metal layer composed of a first metal, of a first thickness, of a first thermal characteristic;
   (b) a facsimile web comprising a second layer, said second layer composed of a second material, of a second thickness of a second thermal characteristic;
   (c) means to superimpose said master web in fixed relation on said facsimile web;
   (d) optical means to focus a continuous beam of laser radiation of a selected constant level of intensity, and to direct said beam onto the surface of said master web, and means to relatively move said beam of laser radiation over substantially the entire area of said pattern on said master web at a selected velocity; and wherein
   (e) said first metal has a higher melting point than the melting point of said second material;
   whereby said focussed beam will penetrate said transparent areas in said master web and will irradiate said second layer below, and will burn areas in said second layer in a second pattern which is substantially similar to said first pattern.

2. The system as in claim 1 in which said second layer comprises the surface layer of a relatively thick slab of said second material, and wherein said focussed laser beam penetrates only part way into said second material, whereby said laser forms depressions in the surface of said second material.

3. The system as in claim 2 in which said slab of second material is organic material.

4. The system as in claim 3 in which said slab of organic material is composed of wood fibers.

5. The system as in claim 1 in which said means to relatively move said laser beam over substantially the entire area of said master web comprises;
   (a) means to wrap said master and facsimile webs at least partially around a rotating drum;
   (b) means for directing said laser beam radially inwardly to said master web; and
   (c) means to relatively traverse said laser beam and said webs, axially, while said drum rotates.

6. The system as in claim 1 in which said means to relatively move said laser beam over substantially the entire area of said master web comprises;
   (a) means to insert said master and facsimile webs around the interior surface of a cylindrical shell;
   (b) means to direct said laser beam radially outwardly against said master web; and
   (c) means to rotate said laser beam about the axis of said cylinder while relatively axially traversing said webs and said beam.

7. The system as in claim 1 in which said master web comprises a flexible strip and said facsimile web comprises a strip, and including;
   (a) means to form said master web into a master loop;
   (b) means for positioning said loop over, colinear with, and contiguous with said facsimile strip;
   (c) means to traverse said loop and said strip together; and
   (d) means to scan said laser beam across the surface of said loop.

8. The system as in claim 1 in which said master web is a strip, said facsimile web is a strip, and said strips are in contiguous linear relation, and including means to form said strips into a sector of an arc with the axis of said arc along the length of said strip, and means to traverse said strip past said focussed laser beam while rotating said beam about an axis coaxial with the axis of said arc.

9. The method of transferring a preselected pattern of optically differentiatable areas on a first web of a first material capable of being penetrated by a focussed laser beam, to a second underlying layer of material capable of being cut by a focussed laser beam comprising the steps of:
(a) superimposing in fixed relation said first web on said second underlying material;
(b) focussing a beam of laser radiation of controllable intensity and directing said beam to the surface of said first web at a selected location;
(c) applying a selected level of intensity of optical radiation to the surface of said first web at said selected location;
(d) detecting at least one parameter of the radiation backscattered from the surface of said first web at said selected location;
(e) controlling the intensity of said beam of laser radiation as a selected function of said parameter of said backscattered radiation; and
(f) relatively traversing said selected location over at least a part of said pattern.

10. The method as in claim 9 in which said at least one parameter is the intensity of said backscattered radiation.

11. The method as in claim 9 in which said second underlying layer of material comprises a thick slab of material, thicker than the depth of burning, whereby the burned areas will be depressions in the surface of said slab and the unburned areas will be raised above the level of the depressed surface.

12. The method as in claim 9 in which said second underlying material comprises a thin layer of material, thinner than the depth of burning, whereby the burned areas will be perforations through said underlying layer.

13. The method as in claim 9 in which said selected level of intensity of optical radiation comprises radiation from the laser which provides said focussed laser beam.

14. The method as in claim 9 in which said selected levels of intensity of optical radiation comprises radiation from a source of radiation other than said laser beam.

15. The method as in claim 9 in which said optically differentiatable areas comprise areas of dark and light.

16. The method as in claim 9 in which said optically differentiatable areas comprise areas of different color and including filter means in said means to detect the parameter of the radiation backscattered.

17. The method as in claim 9 in which said optically differentiatable areas comprise areas of high reflectivity and areas of low reflectivity.

18. The method as in claim 9 in which said beam is of long focal length and is scanned in one direction by a rotating multi-faceted mirror.

19. The method as in claim 9 in which said beam is further scanned by a mirror rotating about an axis at right angles to the axis of said multi-faceted mirror.

20. The method as in claim 9 which includes the step of oscillating said focussed laser beam at a rapid rate, through a selected small angle, in a plane substantially perpendicular to the direction of the path followed by said laser beam over said master web, whereby a path of selected width is swept out by said laser beam with each traverse of said beam across said master web.

21. In a system having a preselected pattern of optically opaque and transparent areas in a first master web, comprising a first metal layer having a first melting point, the method of duplicating said pattern onto a facsimile record web, said facsimile record web comprising a second layer of a second material and adapted to be perforated by irradiation by a beam of coherent laser radiation focussed on its surface, comprising the steps of:
(a) placing said master record web on top of said facsimile record web in fixed relation;
(b) directing a beam of coherent laser radiation of selected constant level of intensity through said transparent areas in said first metal layer to, and focussed on the surface of said second material, by relatively sweeping said beam across the surface of said first web; and
(c) adjusting the intensity of said focussed beam in step (b) so as to burn areas in said second material layer without burning areas in said first metal layer; whereby burned areas are formed in said second material in a pattern identical to said first pattern of transparent areas in said first metal layer.

* * * * *